(12) United States Patent
Boller

(10) Patent No.: US 6,299,514 B1
(45) Date of Patent: Oct. 9, 2001

(54) DOUBLE-DISK POLISHING MACHINE, PARTICULARLY FOR TOOLING SEMICONDUCTOR WAFERS

(75) Inventor: Hans-Peter Boller, Fockbek (DE)

(73) Assignee: Peter Wolters Werkzeugmaschinen GmbH, Rendsburg (DE)

(*) Notice: Subject to any disclaimer, the term of this patent is extended or adjusted under 35 U.S.C. 154(b) by 0 days.

(21) Appl. No.: 09/523,115

(22) Filed: Mar. 10, 2000

(30) Foreign Application Priority Data

Mar. 13, 1999 (DE) .............................................. 199 11 313
Feb. 18, 2000 (DE) .............................................. 100 07 390

(51) Int. Cl.$^7$ ...................................................... B24B 7/00
(52) U.S. Cl. .............................. 451/262; 451/41; 451/60; 451/268; 451/285; 451/287
(58) Field of Search .............................. 451/41, 60, 262, 451/268, 285, 287

(56) References Cited

U.S. PATENT DOCUMENTS

| 4,007,560 | * | 2/1977 | Janssen ................................. 451/262 |
| 5,980,366 | * | 11/1999 | Waddle et al. ........................ 451/262 |
| 6,113,467 | * | 9/2000 | Koike ....................................... 451/41 |

FOREIGN PATENT DOCUMENTS 195 47 085  2/1998 (DE).
0 756 917   2/1997 (EP).
0 803 329   10/1997 (EP).

* cited by examiner

*Primary Examiner*—Joseph J. Hail, III
*Assistant Examiner*—Shantese McDonald
(74) *Attorney, Agent, or Firm*—Vidas, Arrett & Steinkraus P.A.

(57) ABSTRACT

A double-disk polishing machine, particularly for tooling semiconductor wafers, comprising a machine housing, an upper and a lower working disk, carrier disks for the lower and upper working disks either of which is connected to a vertical driving shaft which, in turn, are rotatably supported in the machine housing by means of roller bearings and are adapted to be driven by a motor via a gear mechanism wherein cooling channels to which a coolant is fed are formed in each carrier disk, characterized in that each of the carrier disks is mounted with the aid of fastening means on a circumferential ring of a wheel-shaped basic carrier which, in turn, is connected to the driving shaft, the radius on which said fastening means lie which connect said basic carrier to said carrier disk is approximately on half the width of the ring-shaped working disk and said basic carrier for the upper working disk is connected to the shaft or to carrier disk in such a way that the inclination of the upper working disk automatically adapts itself to that of the lower working disk when the two working disks bear under a pressure against the interposed workpieces.

13 Claims, 5 Drawing Sheets

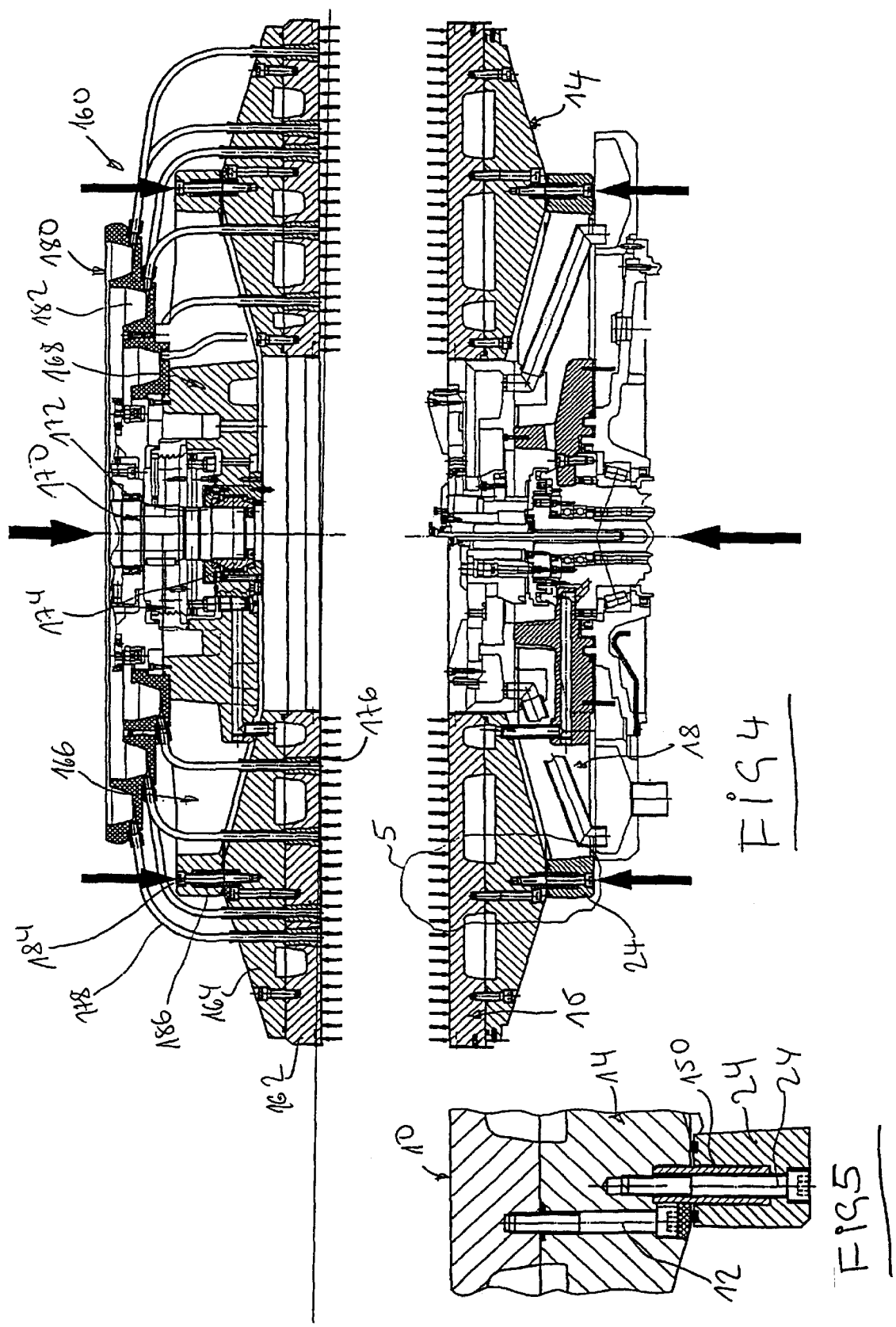

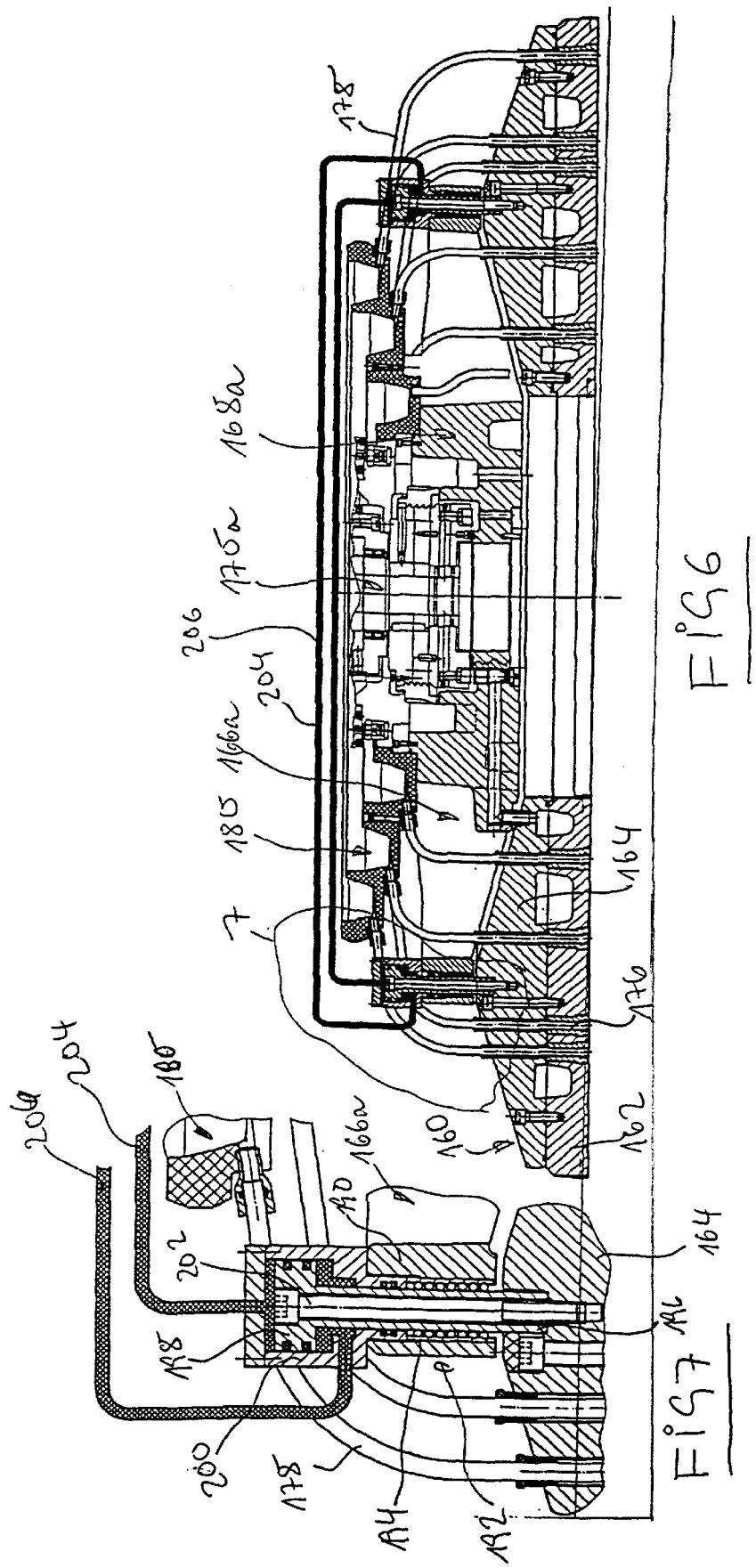

DOUBLE-DISK POLISHING MACHINE, PARTICULARLY FOR TOOLING SEMICONDUCTOR WAFERS

CROSS-REFERENCE TO RELATED APPLICATIONS

Not Applicable

STATEMENT REGARDING FEDERALLY SPONSORED RESEARCH

Not Applicable

BACKGROUND OF THE INVENTION

The invention relates to a double-disk polishing machine, particularly for tooling semiconductor wafers.

Polishing machines of this type are generally known. The semiconductor wafers being worked on two sides become larger and larger when new types are being developed. This creates the requirement for the working disks to have smaller and smaller deviations from geometry if the dimensional accuracy required is to be observed.

In manufacturing wafers polished on two sides with minimum geometrical deviations and good surface characteristics, accuracy in running and dimensional stability of the lower working disk (polishing plate) is a critical factor. In meeting such requirements, solutions for supporting the lower polishing plate have become known which partially are rather expensive, e.g. a hydrodynamic or hydrostatic support.

It is an object of the invention to create a double-disk polishing machine, particularly for tooling semiconductor wafers, which provides a support for the lower polishing plate at a relatively lower expenditure, which also makes it possible to precisely tool semiconductor wafers, which have a larger diameter, to the desired extent.

BRIEF SUMMARY OF THE INVENTION

A substantial feature of the invention is that the working disks, which are formed as ring disks, be sustained in an approximately central way. The basic carrier used for this purpose is connected to the corresponding carrier disk via appropriate fastening means. According to an aspect of the invention, the basic carrier may be designed as a radially spoked wheel the boss of which is in a rotary connection with the driving shaft. Ultimately, the upper working disk of the invention is suspended in such a way that it automatically adapts itself to the inclination of the lower working disk when it changes. This support for the upper working disk may be achieved by a ball-and-socket joint which simultaneously is designed for the transfer of a torque, for example by appropriate teeth intermeshing between the bearing components. As an alternative, a plurality of cylinder units may be disposed between the ring of the basic carrier and the carrier disk, the cylinder spaces of which are filled with a hydraulic medium and are connected to each other so that an "oscillation" of the upper working disk is also possible in this suspension mount.

The invention is based on the findings that even relatively small variations in temperature will result already in changes to the dimensions of the carrier disks. For example, if it is impossible for the carrier disks to freely expand when the temperature rises there is the risk that they will deform and, thus, loose their planarity. Therefore, another aspect of the invention provides that the fastening means between the basic carrier and the carrier disk also allow a relative radial motion. If thermal expansions occur, which naturally are different amongst the components, they will not lead to a deformation of the carrier disk which has an adverse effect on the planarity of the working surface.

In an inventive aspect of the double-disk polishing machine, the shaft of the lower working disk has several axially parallel channels to which cooling water is fed and is discharged therefrom by means of a stationary feeding device. The cooling operation described helps in obtaining high temperature stability for the driving shaft, whereby different axial forces caused by temperature changes and, hence, dimensional changes to the driving shaft affecting the working disk will not occur.

According to another aspect of the invention, the main driving shaft is supported by means of two spaced-apart tapered-roller bearings. The tapered-roller bearings are appropriately dimensioned relatively large and are provided with opposed taper angles so that there is a large stiffness and low flexibility when changes in load occur during the polishing operation. The tapered-roller bearings are preferably biased against each other and against the shaft by means of a nut screwed onto the shaft.

The arrangement of cooling channels on the upper surface of a carrier disk, on which the polishing or working disk is mounted, is known per se. In an aspect of the invention, the cooling channel in the driving shaft is connected to the upper cooling channels of the carrier disk via respective channel portions. Thus, only a single transfer of coolant is required from the stationary machine housing to the rotary parts. Preferably, another axially parallel cooling channel is provided in the driving shaft, which defines the return line of the circulating coolant.

According to another aspect of the invention, the underside of the carrier disk also has cooling channels which preferably are connected to the axial cooling channels in the driving shaft in the same way as the upper cooling channels are. Adjusting the temperature of the coolant of the lower cooling channels (At between top and bottom) also permits to influence the geometry of the carrier disk which is known to be firmly connected, in turn, to the working disk, which will also have an effect on the geometry of the working disk. This is advantageous for differing conditions of the polishing process. Both the upper and lower cooling labyrinths may be cooled separately from each other, using different temperatures.

The driving shaft is driven by an electric motor, preferably via a gear mechanism which, according to an aspect of the invention, has straight radial intermeshing teeth. Preferably, a high quality of the intermeshing teeth is provided. This also makes it possible to exclude axial forces and vibrations acting on the driving shaft.

As mentioned earlier, the carrier disks may be mounted, in turn, on a wheel-shaped basic carrier which, in turn, is connected to the respective driving shaft. The basic carrier is preferably designed in the shape of a cart-wheel wherein the carrier disk is connected, preferably by screws, to the outer ring of the basic carrier at the ends of the spokes. Spacer disks may be provided in making the bolted joint, which serve for balancing the axial run-outs of the basic carrier. What is achieved by the central arrangement of the actuator is that the polishing disks do not non-uniformly deform when the load required for polishing is applied, but uniformly move downwards and upwards with no change to the geometry of the polishing disks.

In spite of precise assembly, it is impossible to completely avoid inaccuracies and warpings, especially on the lower working disk. In order to produce the initial geometry of the polishing disk upon completion of assembly, another aspect of the invention provides that the machine housing has mounting means on diametrically opposed sides of the lower working disk to mount a bridge-like turn-off device which, in a bridge-shaped guide, carries a carriage holding a turn-off tool, which is radially with respect to the working disk moved by a linear drive. When a polishing plate is mounted, which was made in a relatively precise way before, its geometry may be affected by warpings or the like during assembly in the machine. As a result, the lapping operation performed in the machine will take an exceptionally long time unless it is preferred to dismount the polishing disk again and to rework it, which will then also be afflicted by an uncertainty because the polishing surface might happen to have lost its precision again after re-assembly. Lapping by dressing rings does not permit to correct a radial run-out. Lapping allows to adjust the polishing disk in a convex or concave direction. Resurfacing the polishing disk inside the machine will eliminate all inaccuracies in the manufacture of the components used such as the basic carrier, polishing-disk carrier, and polishing disk. In addition, a considerable advantage of time will be obtained. For the turn-off procedure, the polishing-disk carrier with the polishing disk is brought to the processing temperature before by the heated cooling water.

Turn-off devices of the type described are basically known, but have not been directly used on polishing machines hitherto. In an aspect of the invention, the mounting means have an approximately horizontal contact area on one side of the lower polishing plate and sustaining means adjustable in height on the opposed side. The horizontal contact area defines a reference plane and the inclination of the line along which the tool moves radially may be adjusted with the aid of the adjustable sustaining means. In some cases, a funnel-shaped configuration is desirable for the working surface of the polishing plate. This can readily be achieved by means of the construction described.

BRIEF DESCRIPTION OF THE SEVERAL VIEWS OF THE DRAWINGS

The invention is now described with reference to an embodiment shown in the drawings.

FIG. 4 shows a section through a modified embodiment of a polishing machine according to the invention.

FIG. 5 shows the detail 5 of FIG. 4.

FIG. 6 shows a modified embodiment of the upper polishing plate of a polishing machine according to the invention.

FIG. 7 shows the detail 7 of FIG. 6.

DETAILED DESCRIPTION OF THE INVENTION

While this invention may be embodied in many different forms, there are described in detail herein specific preferred embodiments of the invention. This description is an exemplification of the principles of the invention and is not intended to limit the invention to the particular embodiments illustrated.

Figure 1:
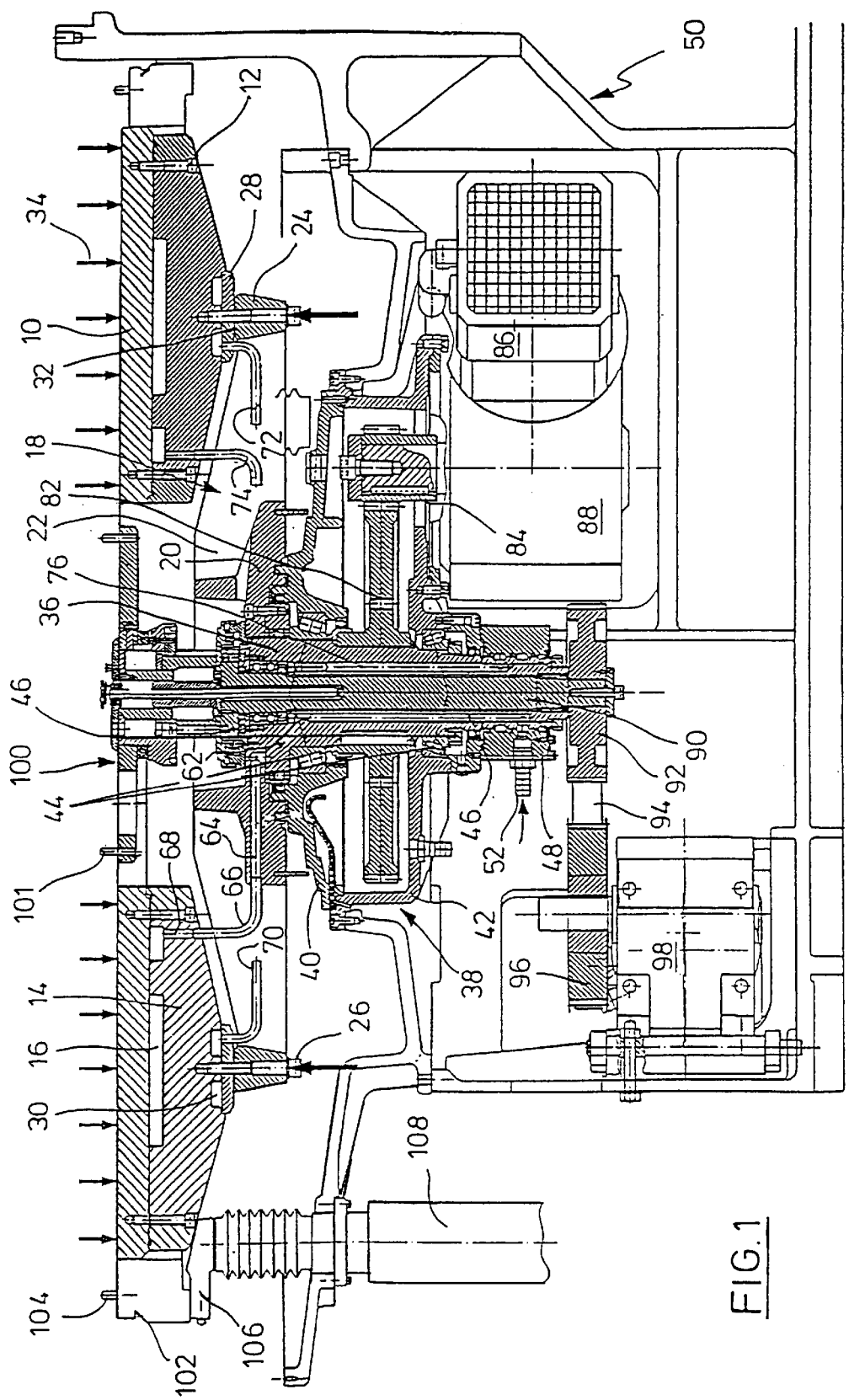
FIG. 1 shows a sectional view of a polishing machine according to the invention.
Figure 2:
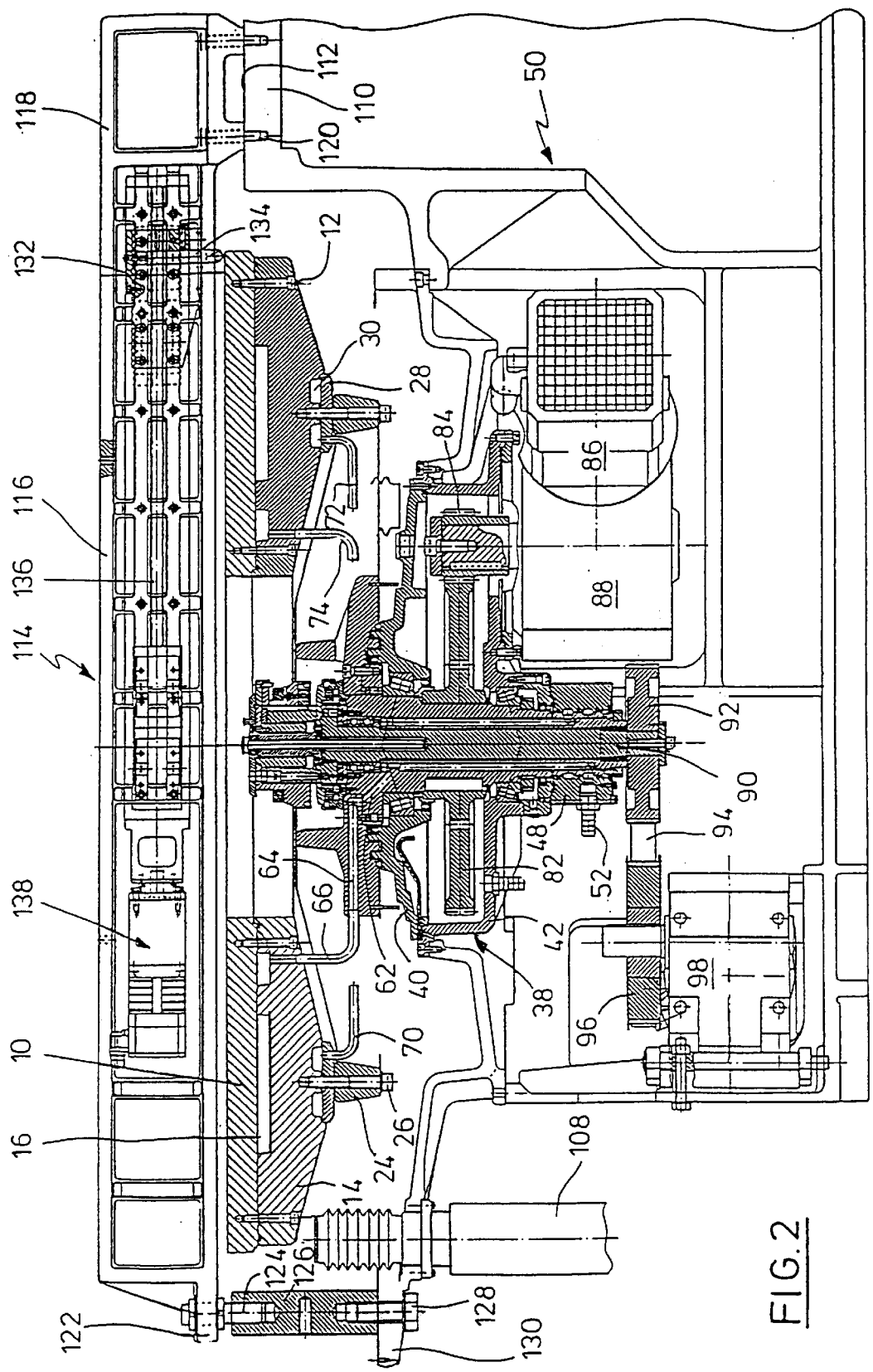
FIG. 2 shows a view similar to FIG. 1 with a turn-off device shown in addition.

Referring to FIGS. 1 and 2, merely the lower part of a double-disk polishing machine is illustrated, which includes a ring-shaped polishing disk 10. The ring-shaped polishing disk 10 is mounted on a ring-shaped carrier disk 14 by means of screws 12. Carrier disk 14 has cooling channels 16 formed in its upper surface.

A basic carrier 18 has a boss 20, spokes 22, and an outer circumferential ring 24 which interconnects the spokes at the outside. Carrier disk 14 is firmly connected to circumferential ring 24 by means of screws 26. A flat ring 28 is disposed between the circumferential ring 24 and the underside of carrier disk 14. It covers cooling channels 30 at the underside of carrier disk 14. Spacer washers 32 are arranged between ring 28 and circumferential ring 32. The mounting of carrier disk 14 on circumferential ring 24 is located on half the radial width of polishing disk 10. As a result, loading forces applied in the direction of arrows 34 do not cause any non-uniform deformation of polishing disk 10.

Boss 20 of basic carrier 18 is connected by means of screws to a driving shaft 36, which vertically extends downwardly through a gearbox casing 38. Gearbox casing 38 has a cover 40 and a shell 42. The cover and shell each support a tapered-roller bearing 44 with the taper angles directed opposite to each other. The upper tapered-roller bearing 44 abuts against a radial flange of shaft 36 and the lower tapered-roller bearing 44 is biased on shaft 36 by means of a nut 46. This construction enables the tapered-roller bearings to be biased towards each other.

The hollow driving shaft 36 has a first axially parallel channel 36. In its lower region, driving shaft 36 is surrounded by a distributor ring 48 which is disposed in a stationary way in machine housing 50. Connected to distributor ring 48 is a nipple 52 which, in turn, is connected to a coolant line (not shown) which, in turn, leads to a coolant source. Nipple 52 is aligned with a radial bore 54 which ends in a continuous circular groove 56 at the inside of the ring. The continuous circular groove 56 is aligned with a continuous circular groove 58 of shaft 35 which, in turn, is in communication with a radial bore 60. Hence, coolant introduced in nipple 52 will flow into the axially parallel channel 46 and, thence, into an oblique bore 62 in boss 20 and, from the oblique bore, into a channel portion 64 which is connected to the upper cooling channels 16 via a line 66 and another channel portion 68. A parallel line 70 passes through a bore in ring 70 such that a connection is also made to the lower cooling channels 30. Return flow is effected through a line 72, which is passed through a bore of ring 28, in communication with lower cooling channels 30 and a line 74 which is in communication with the upper cooling channels 16 via a bore. The lines lead to the second axially parallel channel 76 in driving shaft 36, which is connected to another circular groove 80 in the distributor ring 48 via a second radial bore 78. The circular groove 80 is connected, in a way not shown, to another nipple through which the coolant may exit, possibly back into a reservoir of the coolant source.

Centrally seated on shaft 36 is a spur gear 82 which is in engagement with a pinion 84, which is driven by a motor 86 via a worm gear mechanism 88. The intermeshing teeth between spur gear 82 and pinion 84 is straight and of a high precision.

Coaxially extending through driving shaft 36 is a second shaft 90 which, via a toothed belt, is connected at its lower end to a gear 92 which is driven by a driving gear 96 seated on the shaft of a second motor 98. Shaft 90 has connected to it, at its upper end, an inner pinned rim 100 (the mechanical connection of which is not described in detail because it does not contain any particularity). The pinned rim 100 has a series of pins 101 uniformly spaced in the circumferential direction. Another pinned rim 102 including pins 104 is sustained on the piston rod of a lifting cylinder 108 via a bearing component 106. In case of need, the pinned rim 102 may be driven like the pinned rim 100. Pins 101 and 104 drive toothed runner disks (not shown) resting on the polishing disk 10, which receive the wafers. This is also known as such.

Boss 20 and cover 40 of gearbox casing 38 have provided between them a labyrinth sealing not denoted in detail, which is intended to prevent contaminants from entering the gearbox casing.

As can be seen from FIG. 2 machine housing 50 has a shoulder 110 which has an upper contact area 112 which is located slightly lower than the upper surface of polishing disk 10. A turn-off device 114 has a bridge-like carrier element 116 extending diametrically across polishing disk 10, which ends in a frame portion 118 which is adapted to be attached to shoulder 110 by means of screws 120. At its other end, carrier element 116 has a lug 122 across which device 114 sustains itself. A screw 124 is connected to a spacer 126 which, in turn, is screwed to a bearing portion 130 of machine housing 50 by means of a screw 128. The height and the angle of bridge-like carrier 116 may be adjusted by turning the screw 124.

The bridge-like carrier 116 serves as a guide for a carriage 132 not described in detail, which holds a pin-like turn-off tool 134 of a known design. A driving spindle 136 in the carrier element 116 connects with a driving motor 138 and, in addition, is in communication with carriage 132. This communication is constituted by a ball-screw drive, which enables tool 134 to be moved radially with respect to polishing disk 10 at a relatively low friction.

After polishing disk 10 is installed in place in the above-described way turn-off device 114 is mounted, after which polishing disk 10 undergoes tooling. Prior to this, it was brought to the operating temperature by means of the heated coolant mentioned. This measure can compensate all tolerances which result because of the structure and the parts that the polishing disk 10 carries. Therefore, the lapping process which succeeds may be performed within a minimum period.

The geometry of the driving shaft and carrier disk may be kept to a desired rate by means of the cooling measures described such that changes which even occur irrespective of such measures do not affect the geometry of polishing disk 10. When carrier disk 14 is cooled as well the geometry of polishing disk 10 may be acted on in the desired way to a limited extent. Likewise, the cooling system described will also help in adjusting a certain temperature in polishing disk 10, which is of significance for the turn-off operation.

By adopting the measures discussed in the specification including the turn-off of the polishing disk in the machine it is possible to achieve an axial height run-out of a polishing disk, as referred to the center of rotation, of less than ± 1 m and less than ± 10 m at a short distance from the outer diameter of the polishing disk, at a polishing-disk diameter of 1,535 mm. These values virtually have no longer an adverse effect on the surface quality of the polished wafers.

In the polishing machine of FIG. 4, the arrangement of the lower polishing disk and the drive are configured in the same way as for the embodiment of FIG. 1. Therefore, no detailed reference is intended to be made thereto here. However, what is discerned is that the polishing disk 10, for example, also contains a cooling labyrinth which cooperates with the cooling labyrinth of carrier disk 14. A particular characteristic, however, is the way of attaching carrier disk 14 to ring 24 of basic carrier 18 as illustrated in FIG. 5. Polishing disk 10 is attached to carrier disk 14 by means of fastening screws 12 (also see FIG. 1). Likewise, ring 24 is attached to carrier disk 14 by means of fastening screws 26 disposed at uniform circumferential spacings. Now, a particular characteristic is that the fastening screw is surrounded by a sleeve 150 which is disposed in appropriately widened bore portions of carrier disk 14 and ring 24. When ring 24 and carrier disk 14 are screwed together sleeve 150 will be exposed to an axial stress. However, the sleeve is in the bore at a radial play and also has a radial play with respect to screw 12 so that a limited relative radial motion may take place between the two elements. Hence, a one-sided thermal expansion of basic carrier 18 and ring 24, on one hand, and carrier disk 14, on the other, does not result in a deformation of carrier disk 14 and, thus, a deformation of polishing disk 10.

An upper polishing plate 160 of FIG. 4 has a polishing disk 162, a carrier disk 164, and a basic carrier 166. The interconnection of these elements corresponds to the one for the lower polishing plate so that no detailed reference will be made thereto here. A boss 168 of basic carrier 166 is suspended from a driving shaft 170. Seated at the lower end of driving shaft 170 is a bearing ball 172 which interacts with a bearing shell 174 in boss 168. This permits the whole polishing plate 160 to oscillate to a limited extent and the working surface of polishing disk 162 to automatically adapt itself to the respective inclination of the working surface of the lower polishing plate. Since a torque also requires to be transmitted via shaft 170 the bearing components 172, 174 have curved intermeshing teeth via which the transmission of the torque is effected, but which also allows the oscillation of polishing plate 160.

As can be further discerned polishing disk 162 has a series of axially parallel through bores 176 which are aligned with corresponding through bores in carrier disk 164 and to which lines 178 are connected, through which a polishing agent is passed to the working surface of polishing disk 162. Disposed on boss 168 is a distribution device 180 for the polishing agent, which has three concentrically arranged ring-shaped channels 182 in which the polishing agent is, which is delivered downwardly by the action of gravity.

Figure 3:
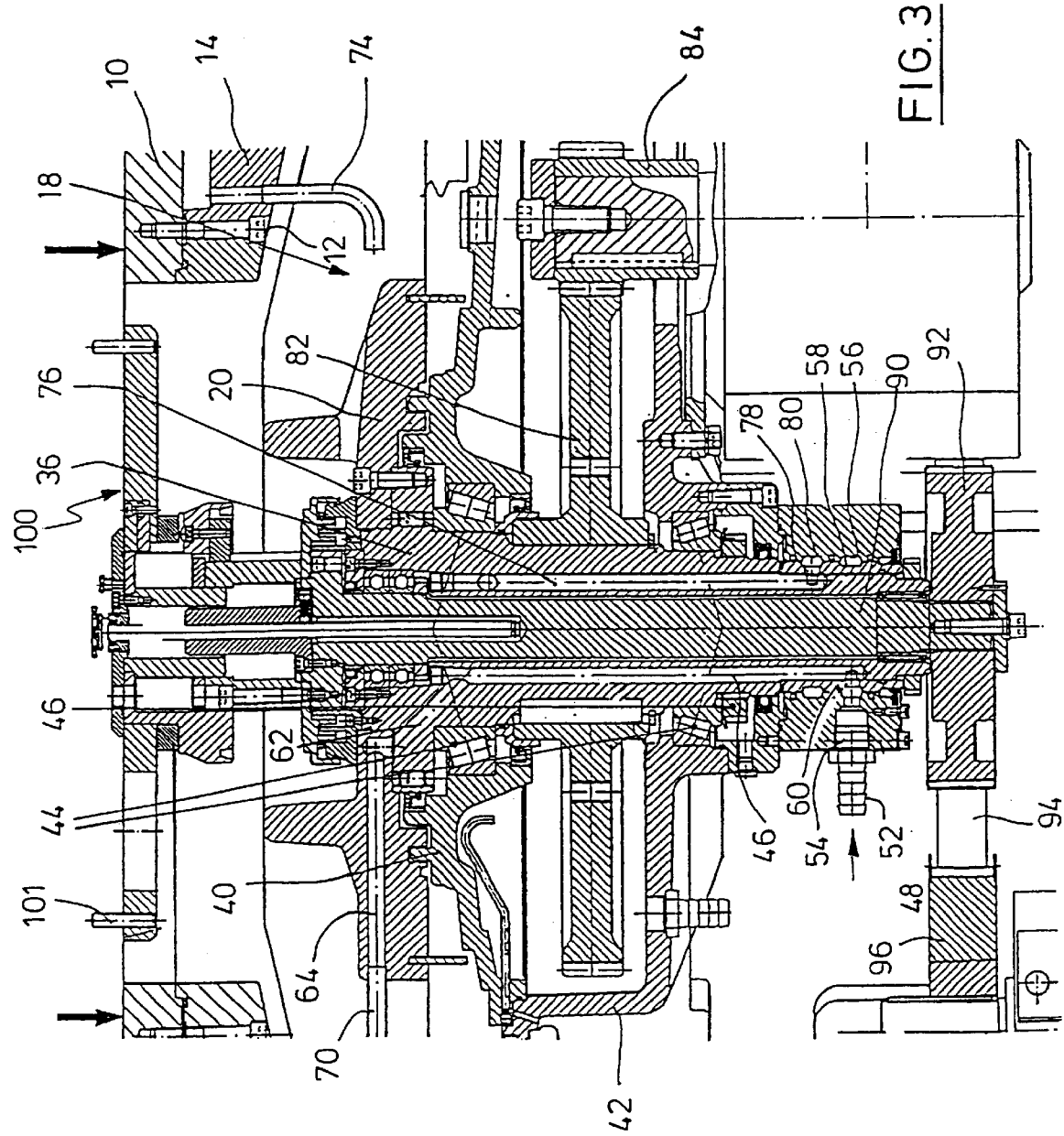
FIG. 3 shows an enlarged view of the central part of the polishing machine of FIG. 1.

Even in attaching basic carrier 166 to carrier disk 164 the procedure adopted is the same as the one described in conjunction with FIGS. 1 to 3, viz. the central attachment of the ring of basic carrier 166 with carrier disk 164. Again, attachment is effected by means of screws 184 which interact with clamping sleeves 186 as was described in conjunction with FIG. 5, which are radially movable to a limited extent or allow a relative motion between screw 184 and sleeve 186 in order that no inadmissible deformation of carrier disk 164 and, hence, of polishing disk 162 be entailed by deformations of carrier 166.

The structure of the polishing plate of FIGS. 6 and 7 is largely equal to the one of the upper polishing plate of FIG. 4. A difference from FIG. 4 is that boss 168*a* of basic carrier 166*a* is firmly connected to shaft 170*a* and, therefore, no oscillation is possible at this point contrary to what the case was for the embodiment of FIG. 4.

A particular characteristic of the embodiment of FIG. 6 consists in the way of attaching carrier disk 164 to basic carrier 166*a*, i.e. to its outer ring. This is illustrated in detail in FIG. 1. As can be discerned from FIG. 7, a piston cylinder unit 192 is disposed between ring 190 and carrier disk 164.

Arranged in a through bore of ring 190 is a spherical sliding guide 194 through which a hollow piston rod 196 is passed. At its upper end, piston rod 196 holds a piston 198, which is sealingly kept moving inside a cylinder 200. Cylinder 200 is firmly connected to ring 190. Passed through piston 198 and the hollow piston rod 196 is a fastening screw 202. It is screwed into a threaded bore of carrier disk 164. On the contrary, piston rod 196 is radially movable in the corresponding bore of carrier disk 164 so that a radial relative motion is possible between basic carrier 166a and carrier disk 164 because of the connection shown.

Both the piston-rod space and the other cylinder space of all piston cylinder units 192 are in communication with each other via lines 204 and 206 as is suggested in FIG. 6. Thus, polishing plate 160 is floatingly suspended from basic carrier 166a and, like the polishing plate of FIG. 4, is adapted to automatically change its inclination while adapting itself to the change in inclination of the working surface of polishing disk 10 of the lower polishing disk of FIG. 4.

The above Examples and disclosure are intended to be illustrative and not exhaustive. These examples and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

What is claimed is:

1. A double-disk polishing machine, particularly for tooling semiconductor wafers, comprising a machine housing, an upper and a lower working disk, carrier disks for the lower and upper working disks either of which is connected to a vertical driving shaft which, in turn, are rotatably supported in the machine housing by means of roller bearings and are adapted to be driven by a motor via a gear mechanism wherein cooling channels to which a coolant is fed are formed in each carrier disk, characterized in that each of the carrier disks (14, 164) is mounted with the aid of fastening means on a circumferential ring (24, 190) of a wheel-shaped basic carrier (18, 166, 166a) which, in turn, is connected to the driving shaft (36, 170, 170a), the radius on which said fastening means lie which connect said basic carrier to said carrier disk is approximately on half the width of the ring-shaped working disk (10, 162) and said basic carrier for the upper working disk (162) is connected to the shaft (170, 170a) or to carrier disk (164) in such a way that the inclination of the upper working disk (162) automatically adapts itself to that of the lower working disk (162) when the two working disks (10, 162) bear under a pressure against the interposed workpieces.

2. The polishing machine according to claim 1, characterized in that the shaft (170) of the upper working disk (162) is coupled to the basic carrier (166) via a spherical bearing the bearing elements of which (172, 174) are in an engagement transmitting a torque via curved intermeshing teeth.

3. The polishing machine according to claim 1, characterized in that the ring (190) of the basic carrier (166a) is connected to said carrier disk via several piston cylinder units (192) disposed at a circumferential spacing wherein the piston rod spaces of the units, on one hand, and the no-piston rod spaces, on the other, are filled with a hydraulic medium and are in communication with each other.

4. The polishing machine according to claim 1, characterized in that the circumferential ring (24, 190) is connected to the boss (20, 168, 168a) via radial spokes (22).

5. The polishing machine according to any of claims 1 to 4, characterized in that the fastening means (24, 150) between the basic carrier (18) and the carrier disk (14) allow a relative radial motion between the elements.

6. The polishing machine according to claim 1, characterized in that the shaft (36) for the lower working disk has at least one axially parallel channel (46, 76) to which a coolant is fed by means of a stationary feeding device (48, 52).

7. The polishing machine according to claim 6, characterized in that the feeding device (48) is disposed in the lower region of the driving shaft (36) and the upper end of the cooling channel (46) is connected to the upper cooling channels (16) in the carrier disk (14) via channel portions (62, 64, 70, 68).

8. The polishing machine according to claim 7, characterized in that another axially parallel channel (76) in the driving shaft (36) is connected, at the upper end, to the upper cooling channels (16) in the carrier disk (14) via channel portions (74) and that the lower end region of the other cooling channel (76) is connected to a discharge port.

9. The polishing machine according to claim 6, characterized in that the lower cooling channels (30) are also connected to a cooling channel in the driving shaft (36).

10. The polishing machine according to claim 1, characterized in that the driving shaft (36) of the lower working disk (10) is supported, by means of two spaced-apart tapered roller bearings (44), by a gearbox casing (38) containing a gear mechanism wherein the inclination of the roller bearings (44) is directed opposite to each other.

11. The polishing machine according to claim 1, characterized in that the driving shaft (36) of the lower working disk (10) has a spur gear (82), which intermeshes with a driving pinion (84) of the motor (86), and that the spur gear (82) and the pinion (84) have straight intermeshing teeth.

12. The polishing machine according to any of claims 1 to 11, characterized in that the machine housing (50) has mounting means (110, 130, 126, 124) on diametrically opposed sides of the lower working disk (10) to mount a bridge-like turn-off device (114) which, in a bridge-like guide (116), carries a carriage (132) holding a turn-off tool (134) which is radially moved with respect to the working disk (10) by a linear drive (136).

13. The polishing machine according to claim 12, characterized in that said mounting means have an approximately horizontal contact area (112) on one side and sustaining means (124, 126) adjustable in height on the opposed side, which are adapted to be mounted in a supporting portion (130) of the machine housing (50).

* * * * *